United States Patent
Wu

(10) Patent No.: US 6,419,008 B1
(45) Date of Patent: Jul. 16, 2002

(54) CPU COOLING DEVICE WITH A MOUNTING MECHANISM

(75) Inventor: Lee-Jen Wu, Taipei Hsien (TW)

(73) Assignee: Nextronics Engineering Corp., Taipei Hsien (TW)

( * ) Notice: Subject to any disclaimer, the term of this patent is extended or adjusted under 35 U.S.C. 154(b) by 0 days.

(21) Appl. No.: 09/986,848

(22) Filed: Nov. 13, 2001

(51) Int. Cl.[7] ................................................ H05K 7/20
(52) U.S. Cl. ..................... 165/80.3; 165/121; 165/185; 174/16.3; 257/719; 361/697; 361/704
(58) Field of Search ................................. 165/803, 121, 165/185; 174/16.3; 257/718, 719, 722; 361/704, 697

(56) References Cited

U.S. PATENT DOCUMENTS

| | | | | |
|---|---|---|---|---|
| 5,930,116 A | * | 7/1999 | Palmer ........................ | 165/185 |
| 6,082,440 A | * | 7/2000 | Clemens et al. ............. | 165/185 |
| 6,201,697 B1 | * | 3/2001 | McCullough ................ | 174/16.3 |
| 6,205,026 B1 | * | 3/2001 | Wong et al. ................. | 165/80.3 |
| 6,243,265 B1 | * | 6/2001 | Wong et al. ................. | 165/185 |

* cited by examiner

*Primary Examiner*—Leonard Leo
(74) *Attorney, Agent, or Firm*—Rosenberg, Klein & Lee

(57) ABSTRACT

A CPU cooling device with a mounting mechanism has at least one pair of wedge members. The wedge member has a positioning end for passing through a through hole of a vertical plate, a protruding block, a snapping plate for retaining a fixing frame by means of engagement of a distal snapping end on the snapping plate and a flange of the fixing frame, and an embedding plate for locking a radiator by inserting the embedding plate into a groove on a ledge of the radiator.

6 Claims, 10 Drawing Sheets

CPU COOLING DEVICE WITH A MOUNTING MECHANISM

BACKGROUND OF THE INVENTION

1. Field of the Invention

The present invention relates to the field of a cooling device for central processing units (CPUs), and more particularly, to a CPU cooling device mounting mechanism having dual mounting purposes.

2. Description of the Prior Art

FIG. 1 shows an exploded view of prior art cooling device assembly. The prior art cooling device assembly generally includes a base frame 1a, a radiator 2a, a top frame 3a, a fan 4a, a pair of spring strips 5a, a pair of pressing strips 6a, a pair of screws 7a and a pair of screw nuts 8a. The base frame 1a includes a frame body 11a having an inner periphery 12a on which a plurality of positioning holes are disposed. The base frame 1a is fixed on a printed circuit board (not shown) by means of the positioning holes 13a and mounting pieces. The inner periphery 12a defines a main opening for accommodating a central processing unit (CPU) that is attached to a bottom surface of the radiator 2a when installation. Typically, the radiator 2a has a plurality radiating fins and is monolithically made of metallic materials known in the art.

As shown in FIG. 1, the frame body 11a has four protruding plate 14a extending upwardly in corners of the frame body 11a. Each protruding plate 14a has a through hole 15a. The radiator 1a is fittingly installed in the base frame 1a and supported by the inner periphery 12a. Since the radiator 2a is higher than the base frame 1a, the top frame 3a is therefore needed. The top frame 3a has a frame body 31a with four snapping feet 32a extending downwardly in the corners of the frame body 31a. Each of the snapping feet 32a has a distal snapping end that engages with the associated protruding plate 14a of the frame body 11a. In this way, the radiator 2a is restrained by the engaged base frame a and top frame 3a. The top frame 3a further includes a corner stage 34a for locking the fan 4a by screws. Two pairs of upwardly extended snapping feet 31a are provided on two opposite sides of the frame body 31a for clamping the fan 4a.

The frame body 31a further includes a central grooves 36a and two side grooves 37a on one side of the frame body 31a. A center part of the spring strip 5a with a ladder shape is mounted into the central groove 36a. The pressing strip 6a is archwise-shaped and has a protruding block 61a, which is embedded in the side groove 37a, disposed in opposite ends of the spring strip 5a. The screw 7a is inserted into a center hole 62a of the pressing strip 6a and fastened with the screw nut 8a. By this configuration, the snapping feet 32a can be controlled by the screw 7a. However, the radiator 2a cannot be steadily restrained by using the prior art structure, since the top frame 3a and base frame 1a just encompass the radiator 2a. Furthermore, the prior art cooling device assembly is complicated and not user-friendly either during assembling or disassembling.

SUMMARY OF THE INVENTION

It is a primary object of the present invention to provide a mounting mechanism for a CPU cooling device.

It is another object of the present invention to provide pairs of wedge members for easily mounting a radiator on a fixing frame so as to form a steady cooling mechanism.

It is still another object of the present invention to provide a cooling device mounting mechanism with pairs of wedge members for easily and simultaneously mounting a radiator and a fan on a fixing frame so as to form a steady cooling structure by only the latching of the pairs of the wedge members.

It is still another object of the present invention to provide a mechanism CPU cooling devices with characteristics of fast assembling and fast disassembling.

It is still another object of the present invention to provide a wedge member having a snapping plate formed integral with the wedge member.

It is still another object of the present invention to provide a wedge member having a protruding block facilitating installation of mounting pieces into a printed circuit board.

According to the claimed invention, the mounting mechanism for CPU cooling devices comprises a fixing frame, a radiator, a fan casing, and at least one pair of wedge members. The fixing frame includes a frame base, an inner periphery located on an inner side of the frame base, at least two mounting holes positioned on the inner periphery for mounting the fixing frame on a circuit board by inserting mounting pieces into the mounting holes, a main opening located at center part of the fixing frame for accommodating a CPU. The fixing frame has four side faces, wherein two opposite side faces thereof each has two ends each extended to a vertical plate with a through hole, while the other side faces is arranged with flanges, respectively.

The radiator has a bottom surface in contact with the CPU, a ledge at periphery of the radiator for connecting with the inner periphery of the fixing frame, and at least one groove located on the ledge.

The wedge member has a positioning end for passing through the through hole of the vertical plate, a protruding block, a snapping plate for retaining the fixing frame by means of engagement of a distal snapping end on the snapping plate and the flange of the fixing frame, and an embedding plate for locking the radiator by inserting the embedding plate into the groove on the ledge.

It is to be understood that both the forgoing general description and the following detailed description are exemplary, and are intended to provide at further explanation of the invention as claimed. Other advantages and features of the invention will be apparent from the following description, drawings and claims.

DETAILED DESCRIPTION OF THE PREFERRED EMBODIMENTS

Figure 1:
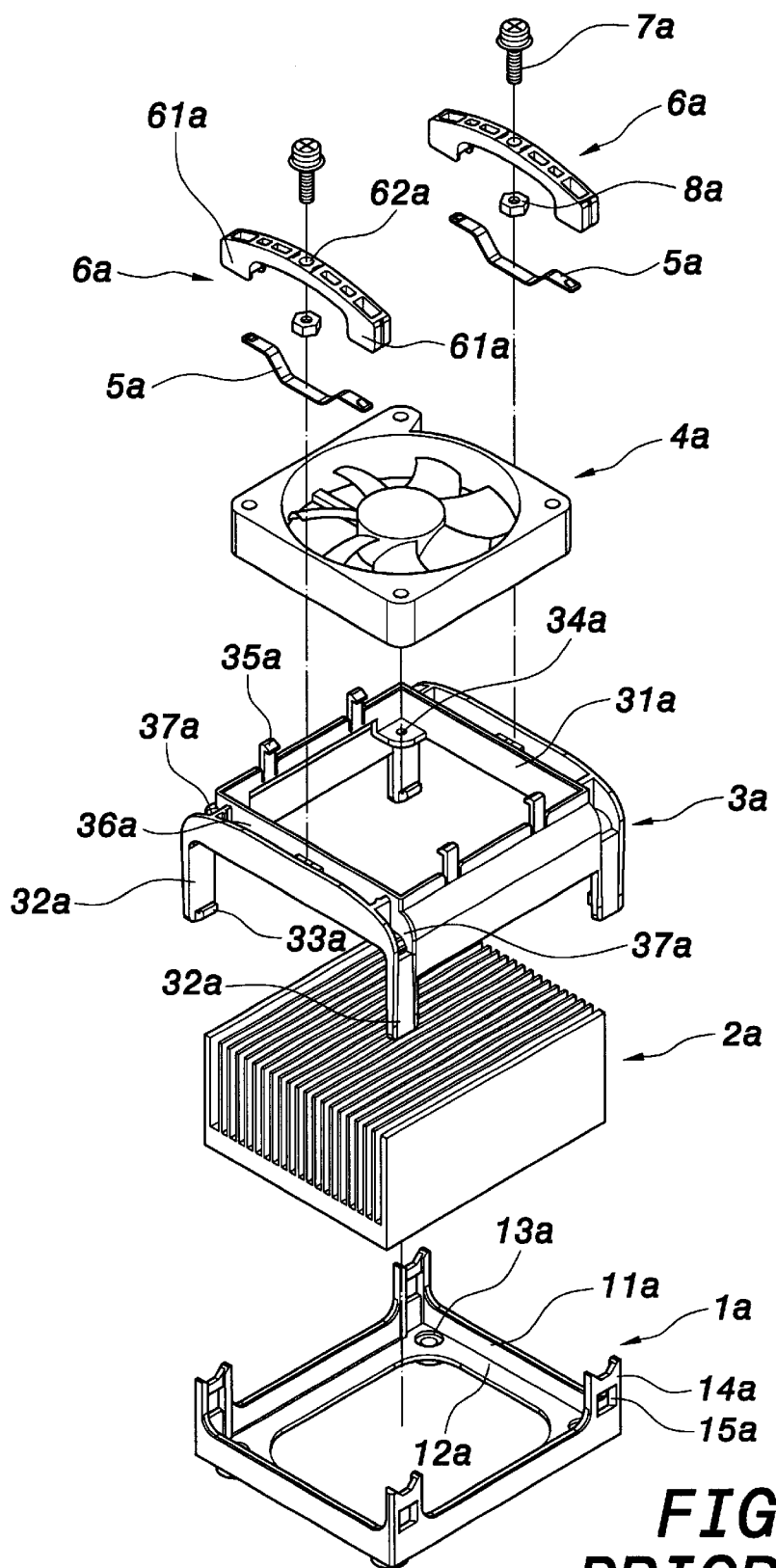
FIG. 1 is an exploded view of prior art cooling device assembly.
Figure 2:
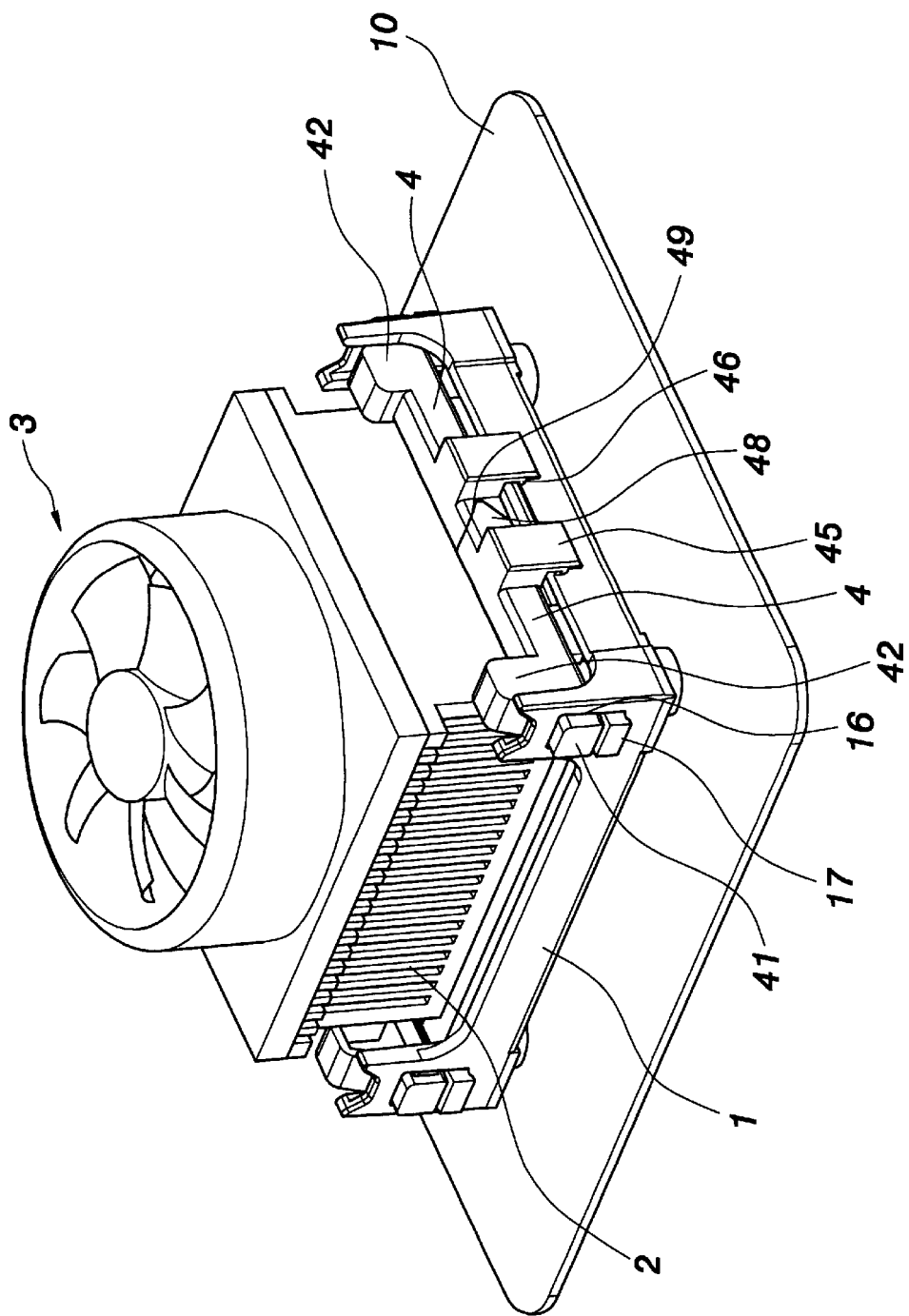
FIG. 2 is a side view of a first embodiment of a cooling device for a CPU according to the present invention.
Figure 3:
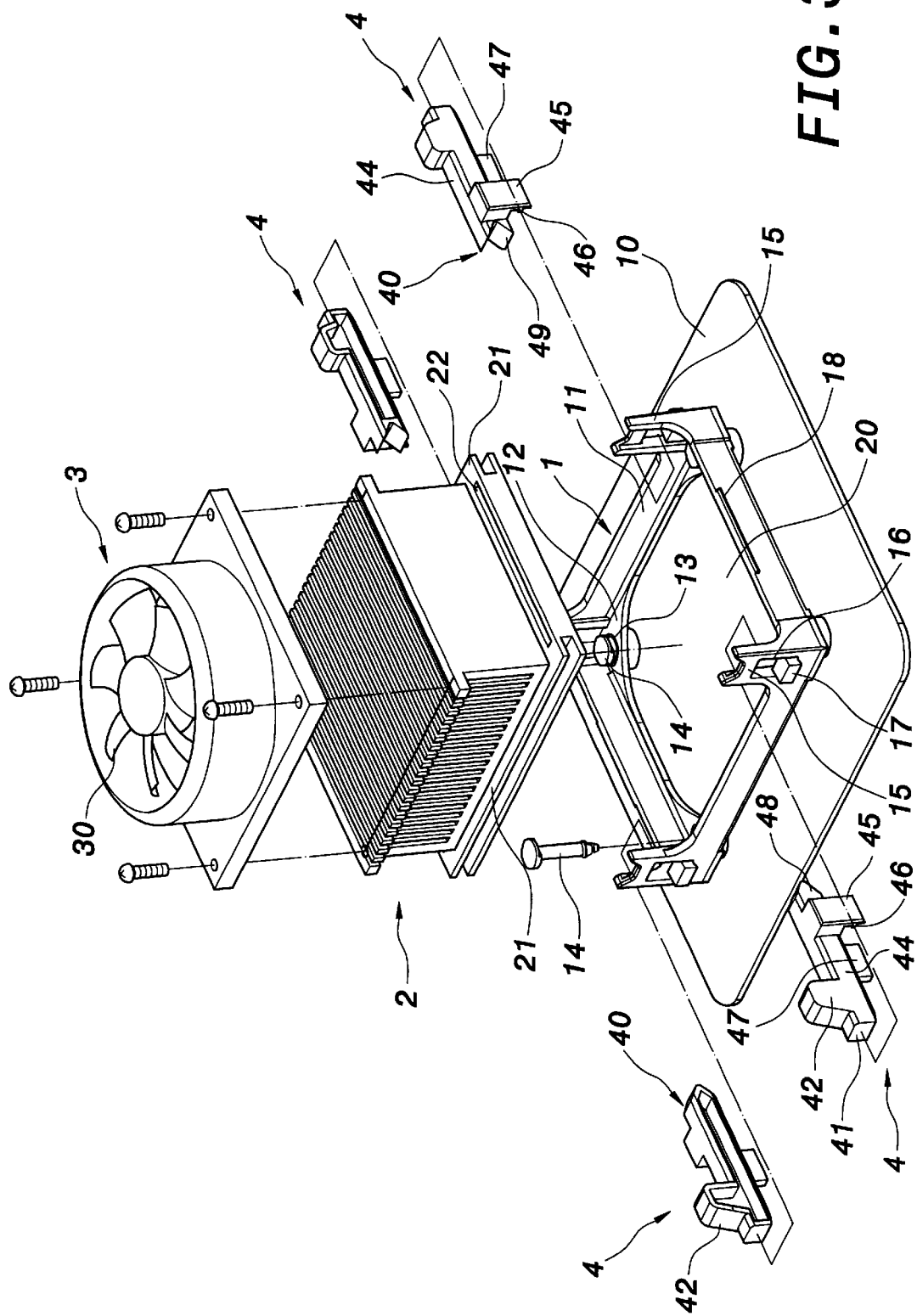
FIG. 3 is an exploded view of the cooling device depicted in FIG. 2.

Referring to FIG. 2 and FIG. 3. FIG. 2 is a side view of a first embodiment of a cooling device mounting mechanism for a CPU according to the present invention, and FIG. 3 is an exploded view of the cooling device mounting mechanism depicted in FIG. 2. The cooling device mounting mechanism of this invention includes a fixing frame 1 having a frame base 11. The frame base 11 is generally a rectangular base with spacing for accommodating a radiator 2. Inner periphery 12 is disposed on an inner side of the frame base 11. Positioning holes 13 are provided in corners of the inner periphery 12. The fixing frame 1 is secured with a printed circuit board 10 by inserting a mounting piece 14 into each of the positioning holes 13. A main opening located at center part of the fixing frame 1 is provided for accommodating a CPU 20. At least one pair of flanges 18 is positioned on outer side of the fixing frame 1.

The radiator 2 includes a bottom surface attached to the CPU 20. Ledges 21, which are used to connect the radiator 2 with the inner periphery, are provided in periphery of the radiator 2. A fan casing 3 including a fan 30 is secured to a top surface of the radiator 2 by screws. Vertical plates 15 extending upwardly at corners of the frame base 11 are provided. A through hole 16 is positioned on each of the vertical plates. A supporting block 17 is disposed below the through hole 16 of the vertical plate 15.

Still referring to FIG. 3, wedge members 4 are provided. Each wedge member 4 has a base 44, a positioning end 41 for passing through the through hole 16 of the vertical plate 15. Preferably, the positioning end 41 has a substantially rectangular cross section. The through hole 16 is also rectangular and has one edge slightly higher than the positioning end 41 when install. In such way, as shown in FIG. 6, the wedge member 4 may swing within a particular angle in a fixed plane by the support of the supporting block 17.

Figure 4:
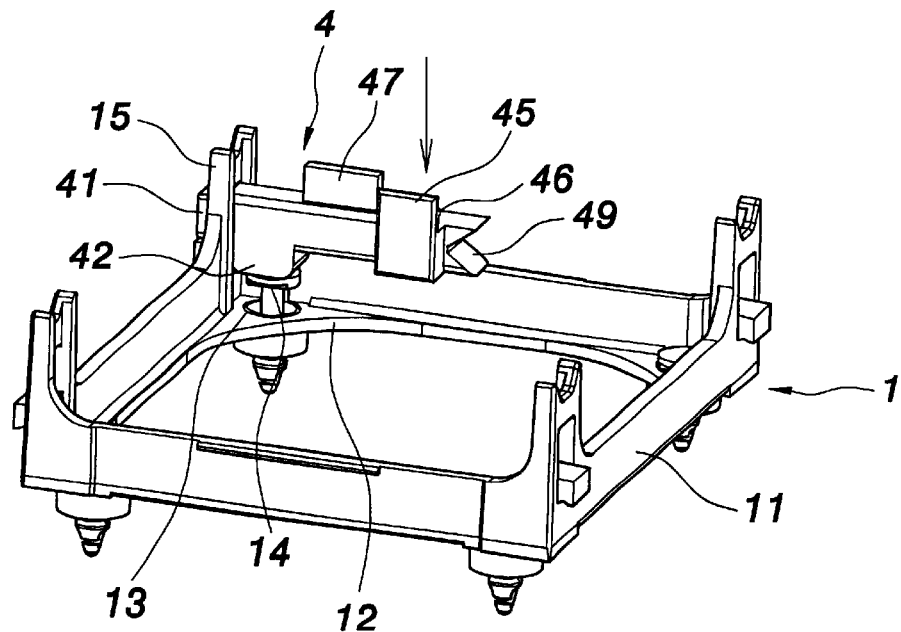
FIG. 4 and FIG. 5 are schematic diagrams illustrating interaction between the wedge member and the mounting piece.
Figure 5:
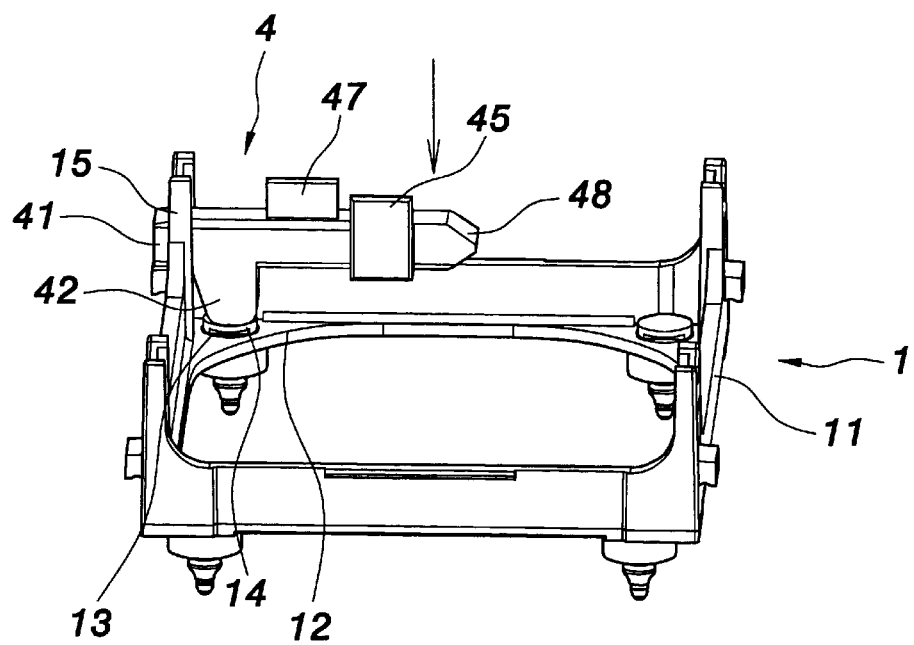
Figure 8:
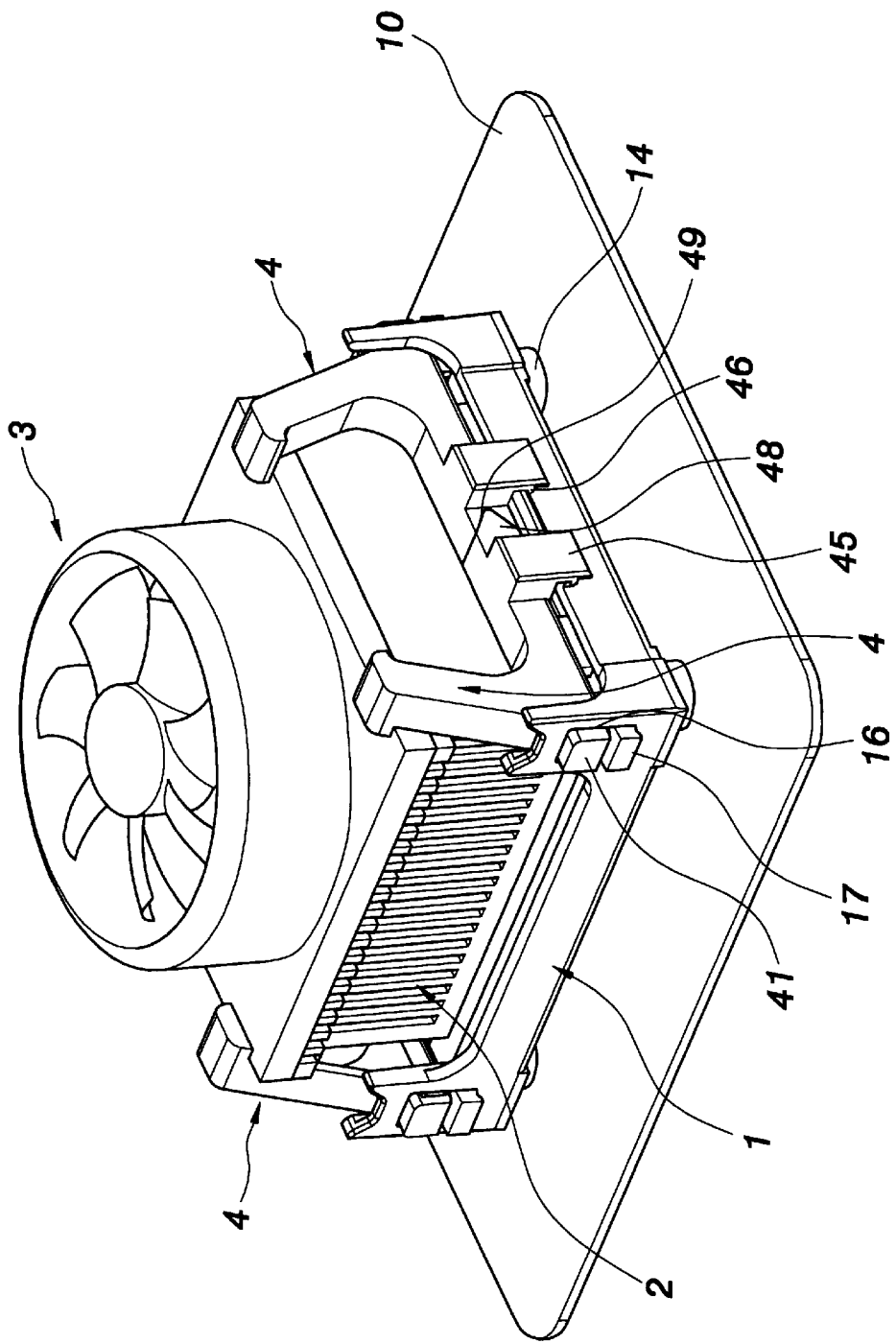
FIG. 8 is a side view of a second embodiment according to the present invention in which elongated protruding blocks are specifically depicted.
Figure 9:
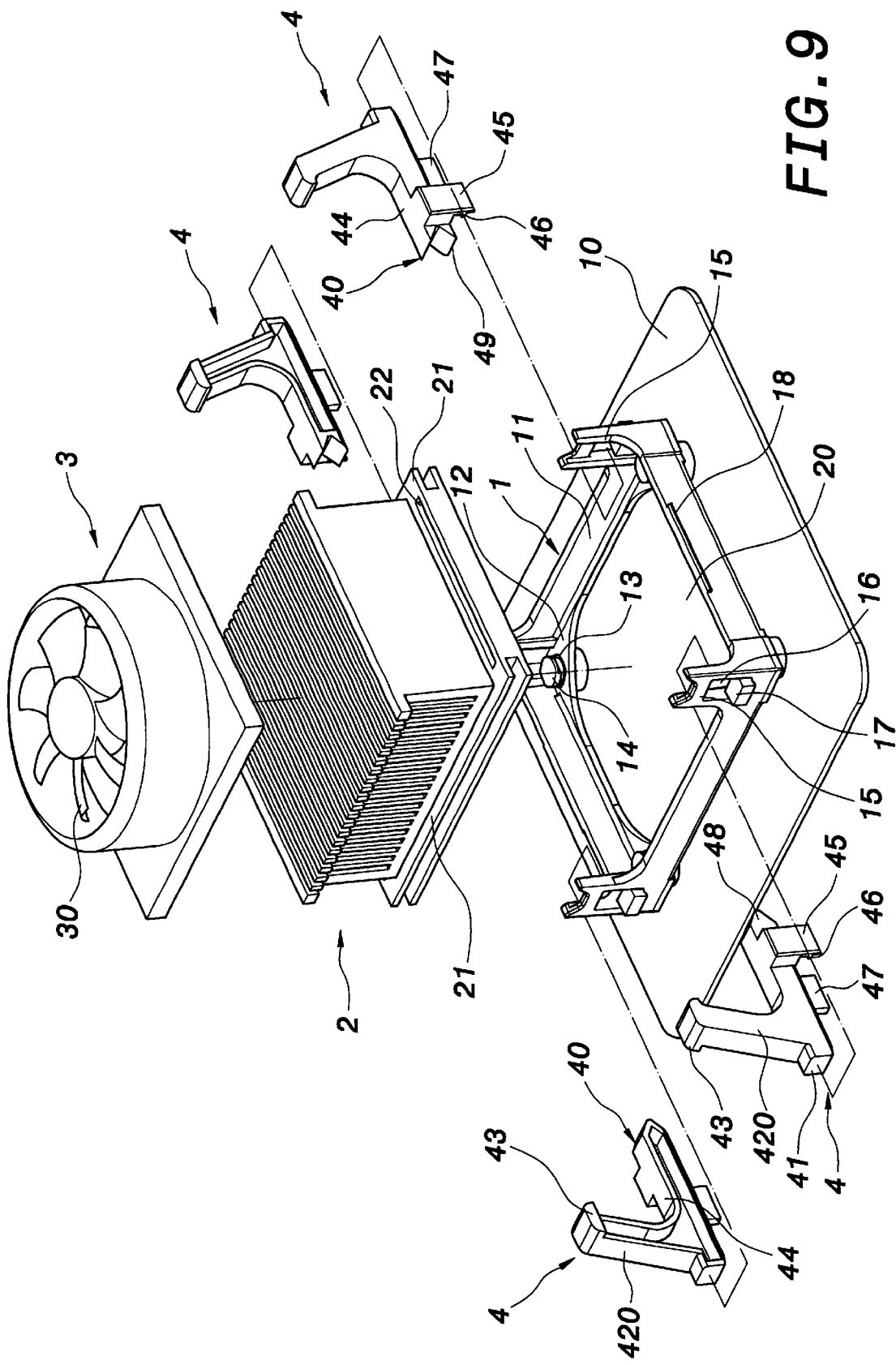
FIG. 9 is an exploded view of the cooling device depicted in FIG. 8.

The base 44 of the wedge member 4 further includes a protruding block 42 extending upwardly to a position below the fan casing 3. Referring to FIG. 4 and FIG. 5, the protruding block 42 is used to downwardly press the mounting piece 14. The protruding block 42 of the base 44 facilitates installation of the mounting pieces 14 into the printed circuit board 10. In another embodiment of the present invention, as shown in FIG. 8 and FIG. 9, a wedge member 4 having an elongated protruding block 420 is provided. The protruding block 420 elongates upwardly to lock a lower rim portion of the fan casing 3 by a distal retaining end 43 of the protruding block 420.

Figure 6:
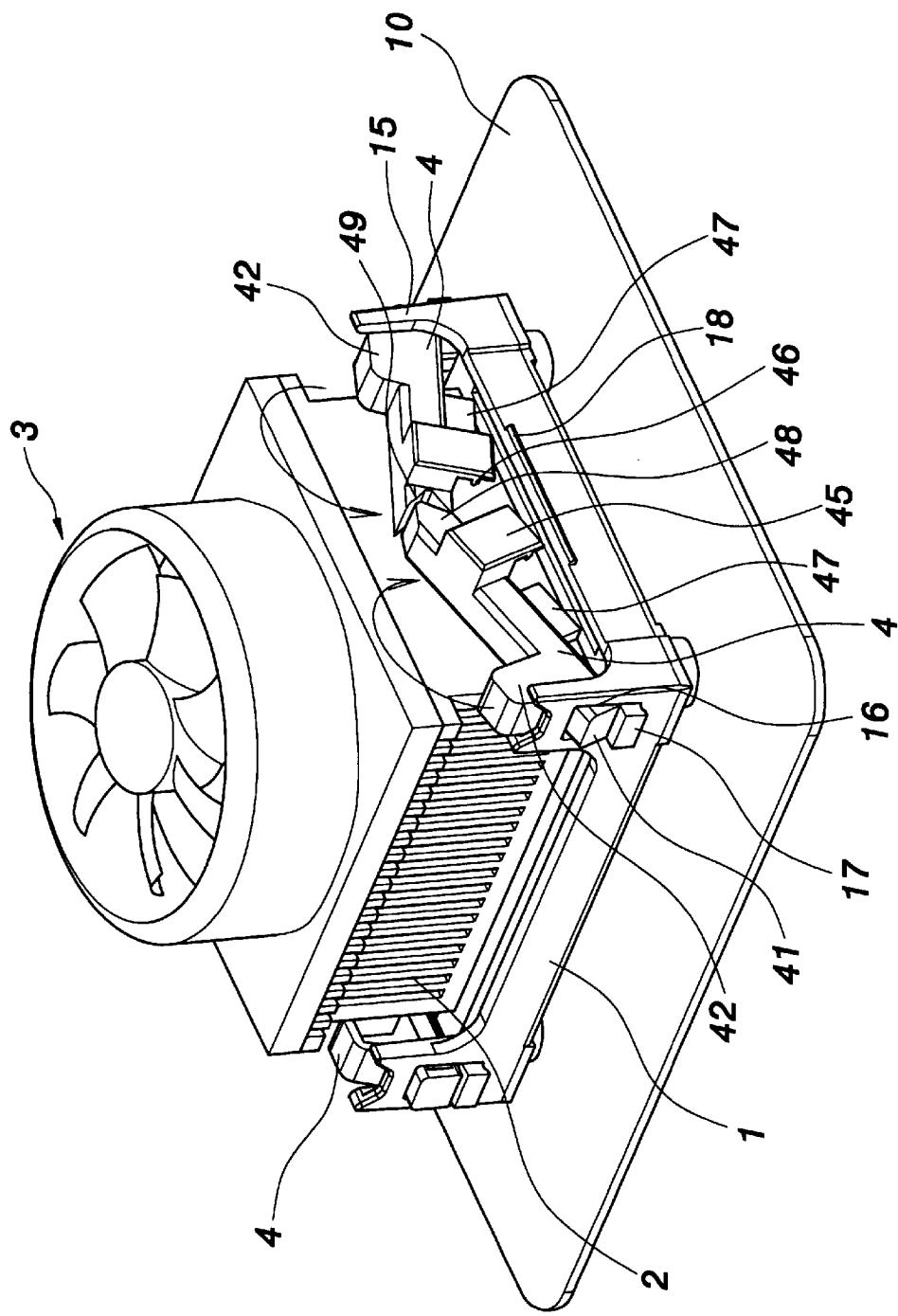
FIG. 6 is a side view illustrating an initial state when mounting the cooling device of FIG. 3 according to the present invention.
Figure 7:
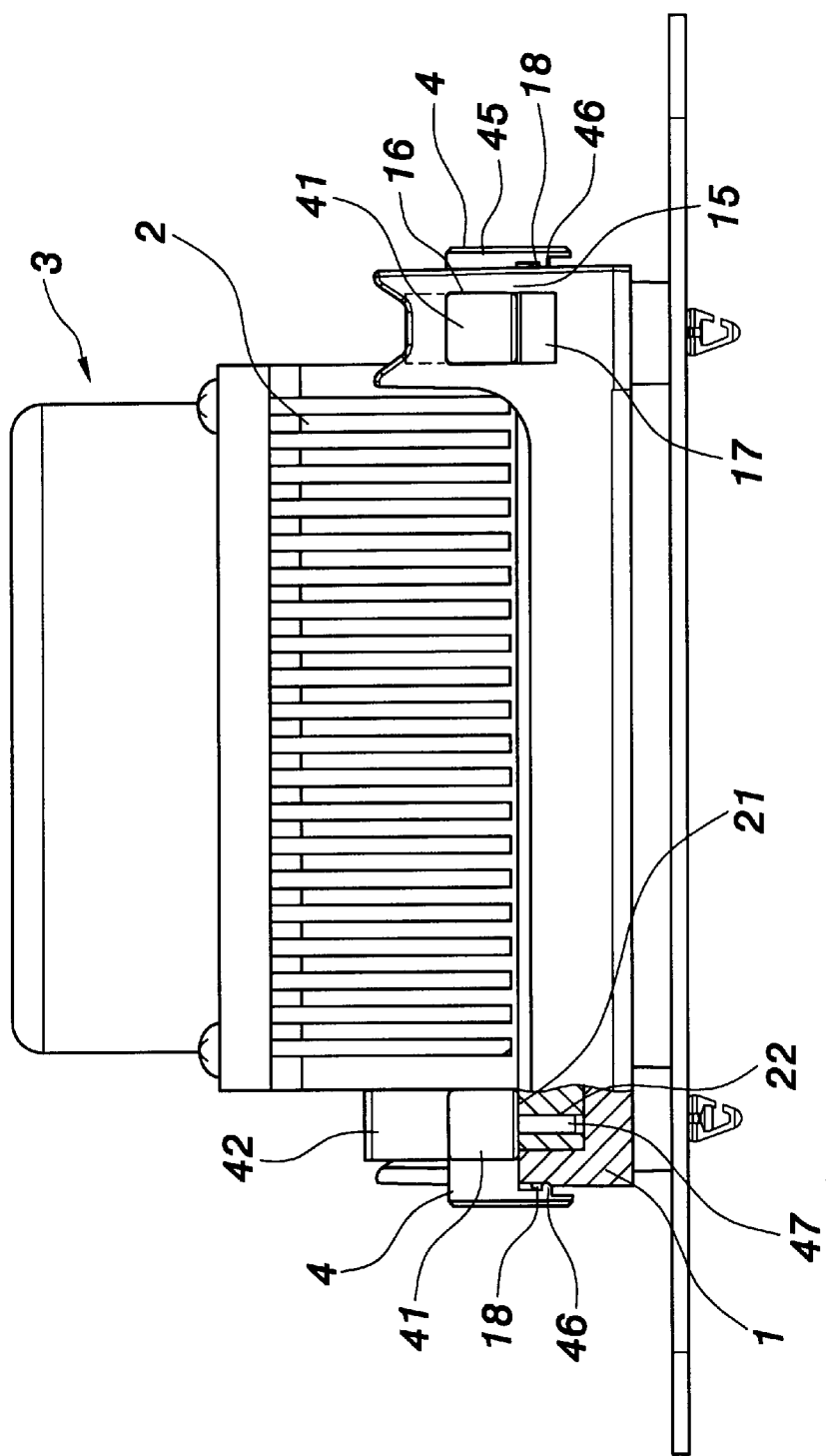
FIG. 7 is a schematic, cross-sectional view illustrating one side of the cooling device after mounting on a PCB according to the present invention.

Referring to FIG. 6 and FIG. 7. FIG. 6 is a side view illustrating an initial state when mounting the cooling device of FIG. 3, and FIG. 7 is a schematic, cross-sectional view illustrating one side of the cooling device after mounting on a PCB. In FIG. 6 and FIG. 7, only one pair of wedge members 4 is expressly depicted. Each wedge member 4 of the pair of wedge members has an engaging end 40. One of the pair of wedge members engages with the other one of the pair of wedge members by latching the two engaging ends. The base 44 of the wedge member 4 further includes a snapping plate 45 for retaining the fixing frame 1 by means of engagement of a distal snapping end 46 on the snapping plate 45 and flange 18 of the fixing frame 1. The base 44 of the wedge member 4 further includes an embedding plate 47 for locking the radiator 2 by inserting the embedding plate 47 into a groove 22 on the ledge 21.

In the first preferred embodiment of the present invention, the engaging end 40 of one of the pair of wedge members has an arris-shaped part 48 and the engaging end 40 of the other one of the pair of wedge members in FIG. 6 has a recessed part 49 for fittingly engaging with the arris-shaped part 48 of the associated engaging end.

Figure 10:
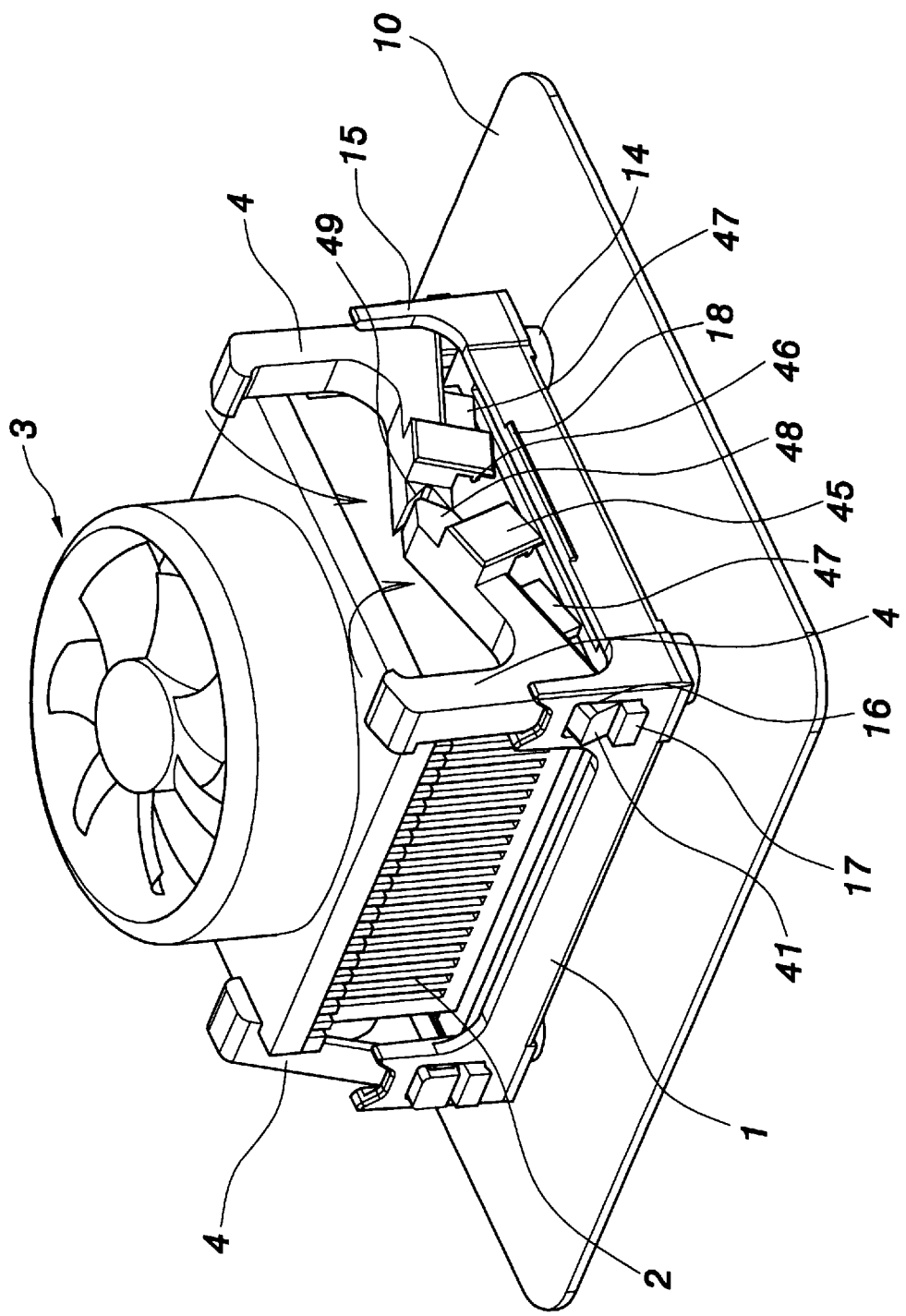
FIG. 10 is a side view illustrating an initial state when mounting the cooling device of FIG. 9 according to the present invention.
Figure 11:
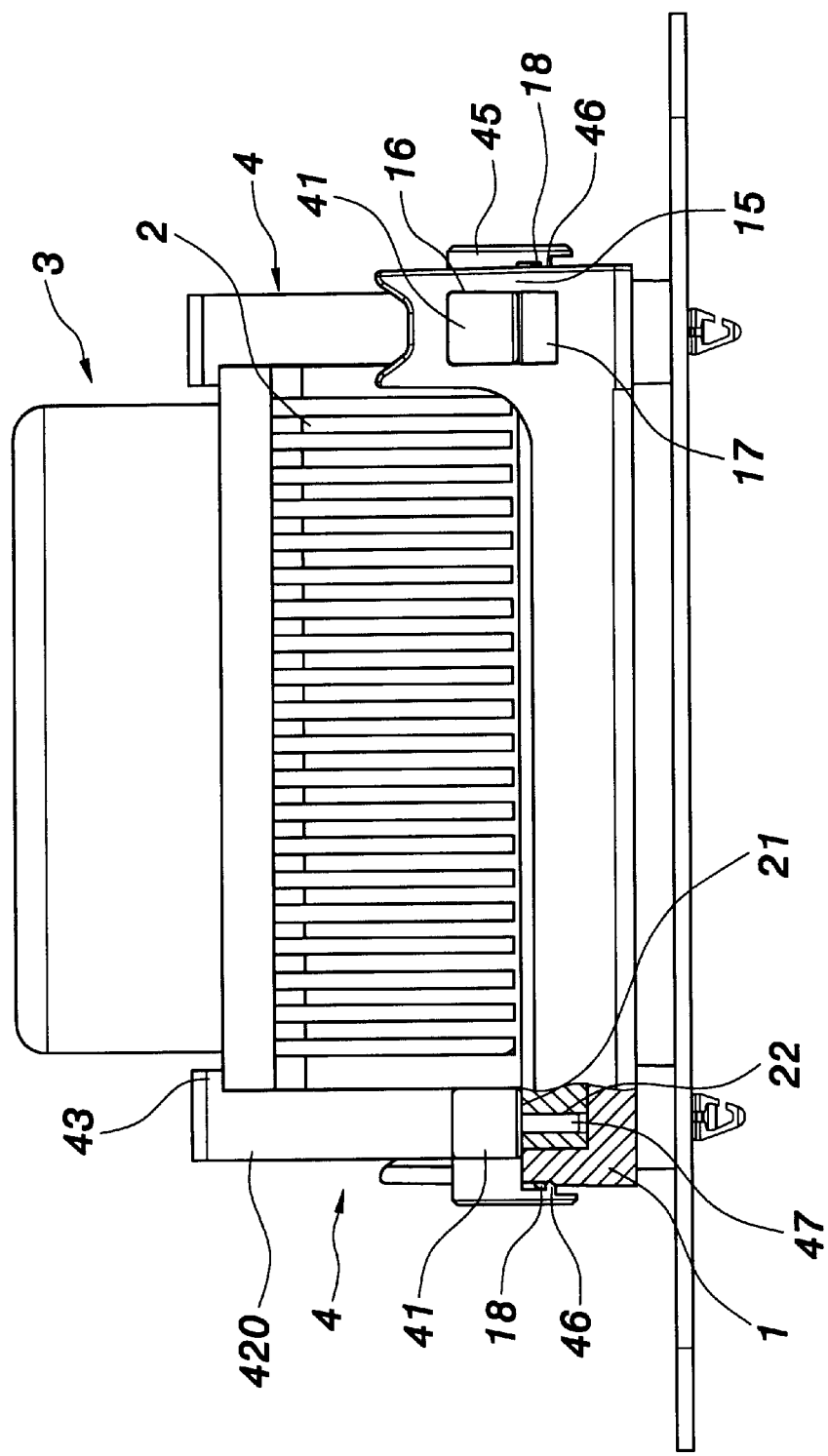
FIG. 11 is a schematic, cross-sectional view illustrating one side of the cooling device of FIG. 9 after mounting on a PCB according to the present invention.

Still referring to FIG. 6 (and FIG. 10), when mounting the CPU cooling device, each engaging end 40 of the pair of the wedge members 4 is obliquely inserted into the through hole 16 of the vertical plate 15 at a suitable angle using the supporting block 17 as a support point. Thereafter, the pair of the wedge members 4 is simultaneously pressed by a downward force, thereby latching the pair of the wedge members 4. Meanwhile, the snapping plate 45 retains the fixing frame 1, and the embedding plate 47 locks the radiator by inserting the embedding plate 47 into the groove 22 of the radiator 2 as shown in FIG. 2, FIG. 7, and FIG. 11.

In short, it is advantageous to use the wedge members 4 of the present invention because the radiator 2 and the fixing frame 1 can be securely clamped at the same time. Moreover, the elongated protruding block 420 may lock the fan casing 3. The protruding block 42 of the base 44 facilitates installation of the mounting pieces 14 into the printed circuit board 10. Further, in contrast to the prior art the CPU cooling device mechanism of the present invention is more cost-effective, user-friendly, and requires less space.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A CPU cooling device with a mounting mechanism, comprising:

a fixing frame including a frame base, an inner periphery located on an inner side of said frame base, at least two mounting holes positioned on said inner periphery for mounting said fixing frame on a circuit board by inserting mounting pieces into said mounting holes, a main opening located at a center part of said fixing frame for accommodating a CPU; said fixing frame having four side faces, two opposite side faces thereof each having two ends each extended to a vertical plate with a through hole, the other side faces being arranged with flanges, respectively;

a radiator having a bottom surface in contact with said CPU, a ledge at a periphery thereof for connecting with said inner periphery of said fixing frame, and at least one groove located on said ledge; and at least one pair of wedge members each having a positioning end for passing through said through hole of said vertical plate, a protruding block, a snapping plate for retaining said fixing frame by means of engagement of a distal snapping end on said snapping plate and said flange of said fixing frame, and an embedding plate for locking said radiator by inserting said embedding plate into said groove on said ledge.

2. The CPU cooling device with a mounting mechanism of claim 1, wherein each wedge member of said pair of wedge members has an engaging end and one of said pair of wedge members engages with the other one of said pair of wedge members by latching said engaging end.

3. The CPU cooling device with a mounting mechanism of claim 2, wherein said engaging end of one of said pair of wedge members has at least one arris-shaped part and said engaging end of the other one of said pair of wedge members has at least one recessed part for fittingly engaging with said arris-shaped part.

4. The CPU cooling device with a mounting mechanism of claim 1 further comprising a supporting block disposed below said through hole of said vertical plate.

5. The CPU cooling device with a mounting mechanism of claim 1 further comprising a fan casing secured with said radiator.

6. The CPU cooling device with a mounting mechanism of claim 5, wherein said protruding block extends upwardly to restrain said fan casing by a distal retaining end of said protruding block.

* * * * *